United States Patent
Loong (10) Patent No.: US 7,020,864 B1
(45) Date of Patent: Mar. 28, 2006

(54) OPTIMIZED TECHNOLOGY MAPPING TECHNIQUES FOR PROGRAMMABLE CIRCUITS

(75) Inventor: Low Yau Loong, Penang (MY)

(73) Assignee: Altera Corporation, San Jose, CA (US)

( * ) Notice: Subject to any disclaimer, the term of this patent is extended or adjusted under 35 U.S.C. 154(b) by 284 days.

(21) Appl. No.: 10/721,573

(22) Filed: Nov. 24, 2003

(51) Int. Cl.
*G06F 17/50* (2006.01)

(52) U.S. Cl. .............................. 716/16; 716/17; 716/18; 716/3; 716/2; 716/7

(58) Field of Classification Search .................. 716/16, 716/17, 18, 3, 2, 7
See application file for complete search history.

(56) References Cited

U.S. PATENT DOCUMENTS

| | | | | |
|---|---|---|---|---|
| 4,703,435 A | * | 10/1987 | Darringer et al. | 716/18 |
| 5,128,871 A | * | 7/1992 | Schmitz | 716/17 |
| 5,359,537 A | * | 10/1994 | Saucier et al. | 716/18 |
| 5,461,577 A | * | 10/1995 | Shaw et al. | 716/17 |
| 5,610,829 A | * | 3/1997 | Trimberger | 716/16 |
| 5,835,751 A | * | 11/1998 | Chen et al. | 716/16 |
| 5,974,242 A | * | 10/1999 | Damarla et al. | 716/2 |
| 6,038,386 A | * | 3/2000 | Jain | 716/16 |
| 6,080,204 A | * | 6/2000 | Mendel | 716/7 |
| 6,148,433 A | * | 11/2000 | Chowdhary et al. | 716/1 |
| 6,289,488 B1 | * | 9/2001 | Dave et al. | 716/1 |
| 6,336,208 B1 | * | 1/2002 | Mohan et al. | 716/16 |
| 6,594,808 B1 | * | 7/2003 | Kale et al. | 716/8 |
| 6,601,221 B1 | * | 7/2003 | Fairbanks | 716/5 |
| 6,622,291 B1 | * | 9/2003 | Ginetti | 716/9 |
| 6,832,357 B1 | * | 12/2004 | Saluja et al. | 716/2 |
| 2002/0178432 A1 | * | 11/2002 | Kim et al. | 716/18 |
| 2003/0182645 A1 | * | 9/2003 | Fairbanks | 716/5 |
| 2004/0088663 A1 | * | 5/2004 | Wu et al. | 716/6 |
| 2004/0133869 A1 | * | 7/2004 | Sharma | 716/16 |

OTHER PUBLICATIONS

Chen et al., "A New Strategy of Performance-Directed Technology Mapping Algorithm for LUT-Based FPGAs", 1996 IEEE International Symposium on Circuits and Systems, vol. 4, May 12-15, 1996, pp. 822-825.*
Yan, "Logic Synthesis for CPLDs and FPGAs with PLA-Style Logic Blocks", Fourteenth International Conference on VLSI Design, Jan. 3-7, 2001, pp. 291-297.*
Chattopadhyay et al., "KGPMAP: Library-Based Technology-Mapping Technique for Antifused Based FPGAs", IEE Proceedings of Computers and Digital Techniques, vol. 141, No. 6, Nov. 1994, pp. 361-368.*

(Continued)

*Primary Examiner*—Matthew Smith
*Assistant Examiner*—Phallaka Kik
(74) *Attorney, Agent, or Firm*—Townsend and Townsend and Crew LLP (57) ABSTRACT

Technology mapping techniques are provided for converting a user design for a programmable integrated circuit to a network of programmable logic blocks. The technology mapping process attempts to combine each non-strategic node and predecessor nodes in one programmable logic block according to only one type of node merging group. If the non-strategic node can be feasibly merged with predecessor nodes according to the merging group, they are grouped into a programmable logic block. The technology mapping process tries to merge strategic nodes with various merging groups of predecessor nodes to form a programmable logic block. The technology mapping process can select the best merging group for the strategic node by using a cost metric. The cost metric can consist of depth and area information of a network for the logic cone.

23 Claims, 7 Drawing Sheets

OTHER PUBLICATIONS

Brasen et al., "Using Cone Structures for Circuit Partitioning into FPGA Packages", IEEE Transactions on Computer-Aided Design of Integrated Circuits and Systems, vol. 17, No. 7, Jul. 1998, pp 592-600.*

Naseer et al., "Direct Mapping of RTL Structures onto LUT-Based FPGAs", IEEE Transactions on Computer-Aided Design of Integrated Circuits and Systems, vol. 17, No. 7, Jul. 1998, pp. 624-631.*

Mathur et al., "Compression-Relaxation: A New Approach to Timing-Driven Placement for Regular Architectures", IEEE Transactions on Computer-Aided Design of Integrated Circuits and Systems, vol. 16, No. 6, Jun. 1997, pp. 597-608.*

Cong et al., "Simultaneous Depth and Area Minimization in LUT-Based FPGA Mapping", Proceedings of the Third International ACM Symposium on Field-Programmable Gate Arrays, 1995, pp. 68-74.*

Francis et al., "Chortle: A Technology Mapping Program for Lookup Table-Based Field Programmable Gate Arrays", Proceedings of 27th ACM/IEEE Design Automation Conference, Jun. 24-28, 1990, pp. 613-619.*

NN81081455, "Conversion of PLA-Logic Implementations", IBM Technical Disclosure Bulletin, vol. 24, No. 3, Aug. 1981, pp. 1455-1456 (4 pages).*

Schlag et al., "Empirical Evaluation of Multilevel Logic Minimization Tools for a Lookup-Table-Based Field-Programmable Gate Array Technology," IEEE Transactions on Computer-Aided Design of ICs and Systems, vol. 12, No. 5, May 1993, pp. 713-722.*

Her et al., "A PLA-Based Algorithm for Estimating Transition Densities in Two-Level Combinational Logic Circuits", 1994 IEEE Asia-Pacific Conference on Circuits and Systems, Dec. 5-8, 1994, pp. 448-453.*

Ruan et al., "Synthesis of Partition-Codec Architecture for Low Power and Small Area Circuit Design", The 2001 IEEE International Symposium on Circuits and Systems, vol. 5, May 6, 2001, pp. 523-526.*

"Command Line Scripting," *Quartus II Handbook vol. 2, Design Implementation & Optimization,* ch. 2, pp. 1-19, Altera Corporation 101 Innovation Drive San Jose, CA (2004).

"Quartus II Integrated Synthesis," *Quartus II Handbook vol. 1, Design & Synthesis,* ch. 8, pp. 1-28, Altera Corporation 101 Innovation Drive San Jose, CA, (2004), pp. 8-1 to 8-28.

"Quartus Programmable Logic Development System & Software," product Data Sheet, May 1999, ver. 1.01, Altera Corporation 101 Innovation Drive San Jose, CA (1999), pp. 1-16.

Chen et al. "Performance-Driven Mapping for CPLD Architecture", Proc. ACM/SIGDA International Symposium on Field Programmable Gate Arrays, Monterey, California Feb. 2001, pp. 39-47 (2001).

* cited by examiner

OPTIMIZED TECHNOLOGY MAPPING TECHNIQUES FOR PROGRAMMABLE CIRCUITS

BACKGROUND OF THE INVENTION

The present invention relates to techniques for mapping a circuit design to a programmable integrated circuit, and more particularly, to efficient technology mapping techniques for programmable integrated circuits.

Programmable integrated circuits can be programmed to implement many types of circuit designs. Examples of programmable integrated circuits include programmable logic devices (PLDs), complex programmable logic devices (CPLDs), field programmable gate arrays (FPGAs), programmable logic arrays (PLAs), and configurable logic arrays (CLAs).

Programmable integrated circuits include numerous programmable logic blocks. Each programmable logic block can be individually configured to implement combinatorial or sequential logic operations.

Altera's MAX family of PLDs are examples of programmable logic devices. Altera MAX devices include numerous programmable logic blocks called macrocells. Each macrocell has a logic array that can be configured to implement various combinatorial functions. Each macrocell also has a flip-flop that can implement sequential logic functions. Arrays of macrocells are grouped together into logic array blocks (LABs) on a MAX device.

A circuit design created by a user can be mapped onto a programmable integrated during a three step process. This process involves synthesis and technology mapping, placement, and routing. During synthesis and technology mapping, logic gates in the user design are converted into programmable logic blocks such as macrocells on a MAX device.

Specifically, synthesis is a process that generates an optimized, technology-independent, gate-level network from a user design. Technology mapping is a process that takes the gate-level network generated during synthesis and converts it to a network of programmable logic blocks. A technology mapping process for a MAX device converts a gate-level network into a network of macrocells.

A typical technology mapping process for a CPLD consists of two phases, a mapping phase and a macrocell-building phase. The mapping phase determines how the gate-level network should be converted to a macrocell network. The macrocell-building phase creates the macrocell network based on information provided by the mapping phase. Some tool also provide a third phase to optimize the macrocell network.

During the mapping phase, the mapper tool processes all the logic cones in the gate-level network of the user design. For each logic cone, the mapper tool maps nodes in the gate-level network in a topological order starting from the input boundary nodes. The topological ordering guarantees that every node is processed after all of its predecessors have been processed.

The mapper tool maps the logic cones by looking for output boundary nodes (i.e. registers or I/O pins). Starting from an output boundary node, the tool traverses backwards to the predecessor nodes in a depth-first-search manner, until reaching the input boundaries before mapping the nodes in a topological order.

Altera's Quartus II MAX Technology Mapper uses a multiple-merging-group algorithm during the mapping phase to provide information for the subsequent macrocell-building phase. It processes the nodes in a topological order starting from the input boundary nodes. Each non-boundary node tries to merge with different groups of predecessor nodes to form a macrocell. If all the merging groups fail to form a feasible macrocell, the node itself is formed as a new macrocell.

Each different merging group generates different depth and area of a macrocell network for the logic cone. Hence, the Technology Mapper selects the best merging group for the node-under-mapping by using a cost metric. The cost metric consists of depth and area information of macrocell network for the logic cone. Depth cost has priority over area cost to reduce the delay of the macrocell network.

The merging groups that the Quartus II Max Technology Mapper uses include (a) merging with all predecessor nodes, (b) merging with nodes until input boundaries or SOFT buffer boundaries, (c) merging with immediate fanin nodes, and (d) merging with nodes included in the best merging group of immediate fanin nodes.

In a multiple-merging-group algorithm such as Altera's Quartus II Max Technology Mapper, every node chooses among different merging groups to form a macrocell. The major weakness of this algorithm is that it cannot create a minimal depth macrocell network, though it may reduce area utilization.

Another type of prior art technology mapping tool is called a labeling algorithm. A labeling algorithm is used during the mapping phase of technology mapping to provide information for the subsequent macrocell-building phase. Its primary goal is to minimize the depth of a logic cone by annotating labels on the nodes during the mapping process.

In a labeling algorithm, every node has only one merging group, i.e. a node merges with predecessor nodes that have the maximum label. The major weakness for a labeling algorithm is that it does not consider other merging groups that may help in further reducing depth and area utilization of the macrocell network.

Therefore, it would be desirable to provide a more robust technology mapping process that optimizes signal delays and reduces area utilization in a synthesized user design for a programmable integrated circuit.

BRIEF SUMMARY OF THE INVENTION

The present invention provides technology mapping techniques for user designs of programmable integrated circuits. The techniques of the present invention process the nodes of a user design in a topological order starting from the input boundary nodes.

A technology mapping process of the present invention attempts to combine each non-strategic node and predecessor nodes into one programmable logic block according to only one type of node merging group. If the non-strategic node can be feasibly merged with predecessor nodes according to the merging group, they are grouped into a programmable logic block.

Other merging groups are considered only when the technology mapping process reaches a strategic node of a logic cone. A strategic node of a logic cone is a node that is the immediate predecessor of the logic cone's output boundary node, and that does not fanout to any other non-boundary nodes. The technology mapping process considers combining a strategic node and predecessor nodes into one programmable logic block according to multiple types of merging groups. If none of these merging groups succeed to form a feasible programmable logic block, the node is formed as a new programmable logic block by itself.

If more than one type of merging group can form a feasible programmable logic block, the technology mapping process selects the best merging group for a strategic node by using a cost metric. The cost metric consists of depth and area information of a network for the logic cone. According to one embodiment, depth cost has priority over area cost to achieve minimal delay.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention involves technology mapping techniques for mapping logic cones to networks of programmable logic blocks. For example, the present invention can be used to map logic cones to networks of macrocells.

However, the techniques of the present invention are not limited to macrocells. Macrocells are discussed herein merely as one example of a programmable logic block that can be used with the present invention. The technology mapping techniques of the present invention can also be used to map logic cones onto other types of programmable logic blocks that are located in different types of PLD and FPGA architectures. For example, the present invention can be used to map logic cones to logic elements, groups of logic elements called logic array blocks (LABs), and configurable logic blocks.

Figure 1:
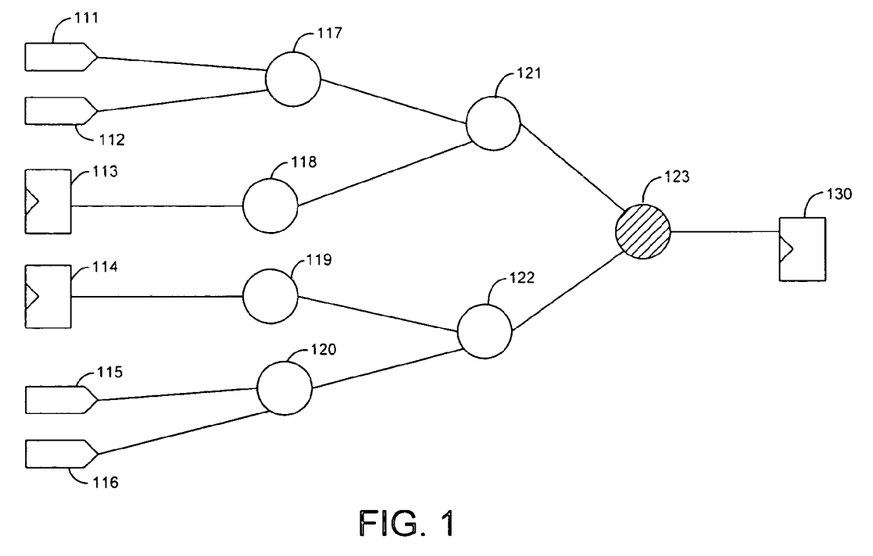
FIG. 1 illustrates an example of a logic cone that represents a user design for a programmable integrated circuit that can be used with the technology mapping techniques of the present invention.

FIG. 1 illustrates an example of a logic cone. A logic cone is a logic region of a user design for a programmable integrated circuit that lies between one output boundary node and several input boundary nodes. In FIG. 1, the logic cone lies between input boundary nodes 111–116 and output boundary node 130. Input boundary nodes can include input pins and registers. Output boundary nodes can include output pins and registers. The logic cone includes nodes 117–123.

A sub-cone is a logic region that lies between one node and all its predecessor nodes, ending at input boundary nodes. A sub-cone lies within a logic cone. In FIG. 1, nodes 121 and 117–118 are a sub-cone that lie between node 121 and input boundary nodes 111–113. Predecessor nodes are fanin nodes and are pictured to the left of a node in the Figures. Nodes 117–118 are predecessor nodes to node 121.

A non-strategic node is a non-boundary node in a logic cone that is not a strategic node. A strategic node of a logic cone is a node that is the immediate predecessor of the logic cone's output boundary node, and that does not fanout to any other non-boundary nodes. The non-strategic nodes in the FIG. 1 are nodes 117–122. Node 123 is a strategic node, because it fans out to output boundary node 130.

Figure 2:
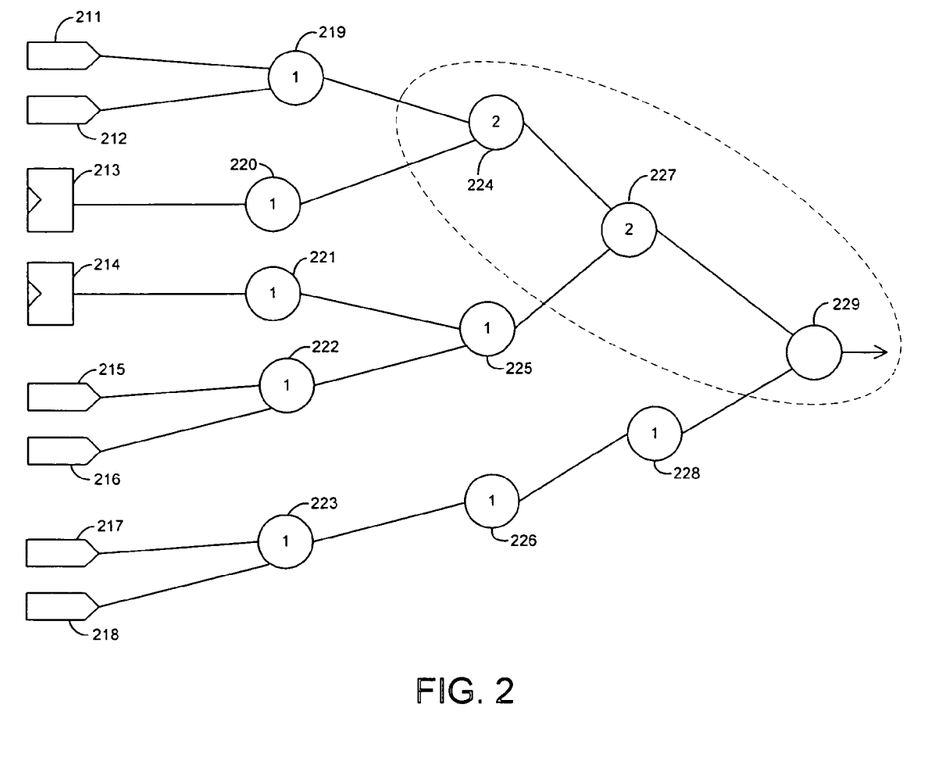
FIG. 2 illustrates an example of how a technology mapping process of the present invention can attempt to merge a non-strategic node with predecessor nodes that have the maximum label.

The technology mapping process of the present invention attempts to merge each non-strategic node and its predecessor nodes that have a maximum label, as shown, for example in FIG. 2. In FIG. 2, the input boundary nodes are nodes 211–218, and the non-boundary, non-strategic nodes are 219–229.

A technology mapping process of the present invention processes each node within a logic cone in a topological order starting from the input boundary nodes and ending at an output boundary node. The process considers whether each non-boundary node can be merged with any of its predecessor nodes into one macrocell.

The technology mapping process assigns a label to each node in the logic cone. Initially, each input boundary node is assigned the label 0. The technology mapping process then attempts to combine each non-strategic node with its predecessor nodes that have the maximum label value. The process first determines if the combination is feasible given the inherent constraints of the macrocell architecture. If the combination is feasible, the non-strategic node is combined with its predecessor nodes that have the maximum label value into one macrocell, and then the non-strategic node is assigned that maximum label value.

For example, node 227 in FIG. 2 is considered to be the current node-under-mapping. Node 224 has the maximum label value (2) of all of the predecessor nodes of node 227. Therefore, if nodes 227 and 224 can be feasibly merged into one macrocell, node 227 is assigned the label 2, and nodes 224 and 227 are combined into one macrocell. If nodes 224, 227 and 229 can be feasibly merged into one macrocell, node 229 is assigned a label of 2, and nodes 224, 227 and 229 are merged into one macrocell. Node 229 is a non-strategic node if its output is not coupled directly to an output boundary node.

The technology mapping process of the present invention only combines nodes into one macrocell after first determining whether the combination is feasible given the architecture of the macrocell. After a particular group of nodes has been selected as a possible merging group, the merging group is converted into another logic form with similar functionality.

The converted logic is in the form of (k, m, 1), which represents with k inputs, m product-terms, and 1 output. This logic form is also called Sum-Of-Product (SOP). A feasible macrocell means that the converted SOP form must have a number of inputs <=k, a number of product-terms <=m, and no more than 1 output.

This feasibility determination method can be applied to the process of determining whether any merging group of nodes discussed herein can be feasibly merged into one macrocell. Feasibility determination methods are different for other types of programmable logic block architectures. Feasibility determinations for Altera's MAX family of PLDs are well known.

If a non-strategic node cannot be feasibly merged into one macrocell with its predecessor nodes that have the maximum label given the macrocell architecture, the non-strategic node is assigned the maximum label of its predecessor nodes plus 1. For example, nodes 219–223 are assigned a label of 1, because they cannot be merged with an input boundary node. Therefore, each of nodes 219–223 are assigned a label of 0+1=1.

According to the present invention, the technology mapping process only merges non-strategic nodes into a macrocell with predecessor nodes according to the labeling process previously discussed. The technology mapping process does not consider other merging groups for non-strategic nodes.

The technology mapping process of the present invention tries to merge each strategic node with two or more merging groups of predecessor nodes to form a new macrocell. If none of the merging groups that are considered can be combined to form a feasible macrocell, the strategic node is formed as a new macrocell by itself.

FIGS. 3A–3E illustrate examples of five different node merging groups that can be considered for combining a strategic node with one or more of its predecessor nodes. The various merging groups shown in these Figures are only considered when a strategic node is the node-under-mapping. Each merging group may generate a different depth and area of a macrocell network for a logic cone.

A technology mapping process of the present invention process can select the best merging group for the strategic node by using a cost metric. The cost metric can consist of depth and area information of macrocell network for the logic cone.

Depth cost is based on the maximum number of macrocell stages from an input boundary to the node-under-mapping. Area cost indicates the total number of macrocells in a sub-cone that of the node-under-mapping. In general, depth cost has priority over area cost to achieve minimal delay macrocell network, and thus depth cost is compared first. If both depth costs are the same for two or more possible merging groups, then only area costs are compared.

Figure 3A:
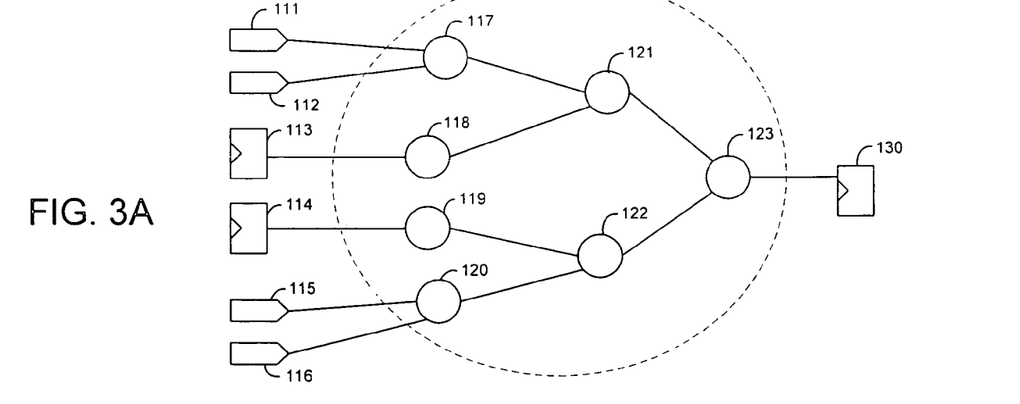
FIG. 3A illustrates an example of how a technology mapping process of the present invention can attempt to merge a strategic node with all of its predecessor nodes.

A technology mapping process of the present invention considers various types of merging groups for combining a strategic node with one or more of its predecessor nodes into one macrocell. One type of merging group combines a strategic node with all of its predecessor non-boundary nodes. FIG. 3A illustrates an example of this type of merging group.

In FIG. 3A, strategic node 123 is merged with all of its predecessor nodes 117–122 that are not input boundary nodes. The merged group is shown inside the dotted oval in FIG. 3A.

The technology mapping process of the present invention then determines whether all of nodes 117–123 can be feasibly merged into one macrocell given the constraints of the macrocell architecture. If the nodes can be feasibly merged into a macrocell, the process calculates a depth cost and an area cost for the macrocell network formed by the merger. If nodes 117–123 are all merged into one macrocell, the depth cost equals one, because there would be only one macrocell between the input and output boundary nodes. The area cost also equals one, because the sub-cone is reduced to one macrocell.

Figure 3B:
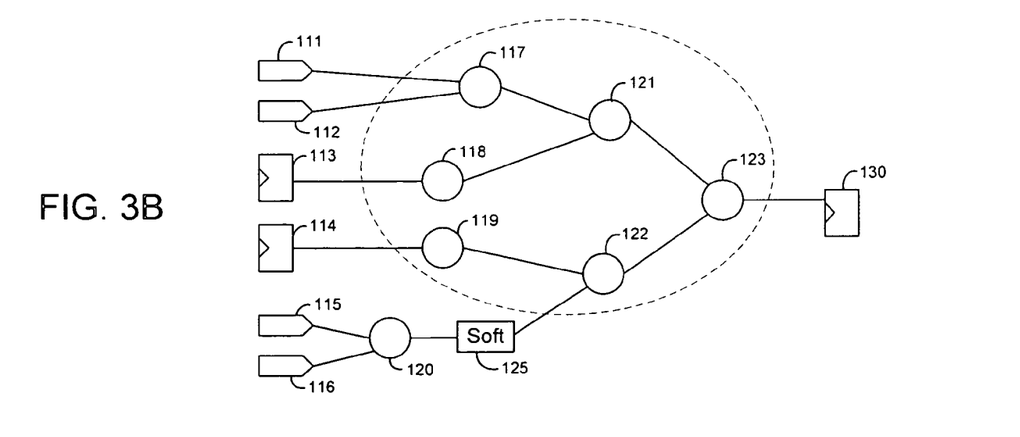
FIG. 3B illustrates an example of how a technology mapping process of the present invention can attempt to merge a strategic node with predecessor nodes until input boundaries or soft buffer boundaries are reached.

Another merging group that can be used to merge a strategic node with one or more of its predecessor nodes is illustrated in FIG. 3B. In this type of merging group, a strategic node is combined with its predecessor nodes in all directions until an input boundary node or a soft buffer boundary node is reached. A soft buffer node is a dummy node that marks a boundary.

In FIG. 3B, strategic node 123 is merged with predecessor nodes 117–119 and 121–122. To form this merging group, the technology mapping process traverses each fanin of strategic node 123. Traversing each of the fanins to node 123 leads to nodes 121, 117 and 118 as well as nodes 122 and 119. The process terminates at input boundary nodes 111–114. Unlike in the example of FIG. 3A, the process also terminates at soft buffer boundary node 125. The resulting merging group is shown inside the dotted oval in FIG. 3B.

The technology mapping process then determines whether nodes 117–119 and 121–123 can be feasibly merged into one macrocell. If nodes 117–119 and 121–123 can be feasibly merged into a macrocell, the process calculates a depth cost and an area cost for the macrocell network formed by the merged nodes.

If nodes 117–119 and 121–123 are merged into one macrocell, the depth cost equals two. Because node 120 forms a separate macrocell, there is a maximum of two stages of macrocells between the input boundary nodes and the output boundary nodes. The area cost also equals two, because two separate macrocells are formed.

Figure 3C:
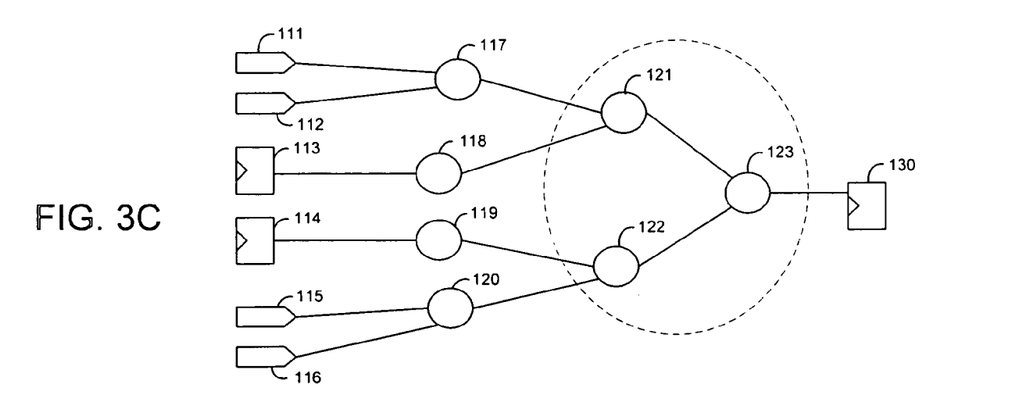
FIG. 3C illustrates an example of how a technology mapping process of the present invention can attempt to merge a strategic node with immediate fanin nodes.

Another merging group that can be used to merge a strategic node with one or more of its predecessor nodes is illustrated in FIG. 3C. In this type of merging group, a strategic node is combined only with its immediately preceding fanin nodes.

In FIG. 3C, strategic node 123 is merged only with its immediately preceding fanin nodes 121–122. Unlike the merging groups in the preceding examples, the technology mapping process only merges the strategic node with fanin nodes that are directly connected to inputs of the strategic node as shown in FIG. 3C.

The technology mapping process then determines whether nodes 121–123 can be feasibly merged into one macrocell. If nodes 121–123 can be feasibly merged into a macrocell, the process calculates a depth cost and an area cost for the macrocell network formed by the merged nodes. If nodes 121–123 are merged into one macrocell, the depth cost equals two, because there is a maximum of two levels of macrocells between the input nodes and the output node. The area cost equals five, because nodes 117–120 each form a separate macrocell.

Figure 3D:
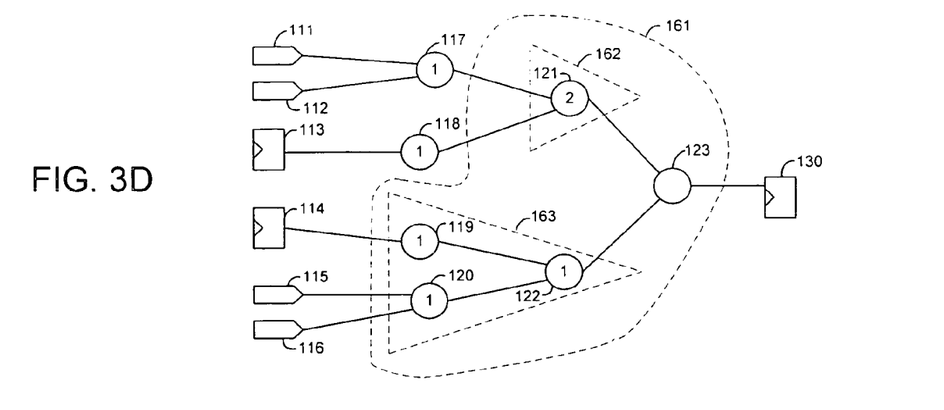
FIG. 3D illustrates an example of how a technology mapping process of the present invention can attempt to merge a strategic node with nodes that are included in the best group of immediate fanin nodes.

Another merging group that can be used to merge a strategic node with one or more of its predecessor nodes is illustrated in FIG. 3D. In this type of merging group, a strategic node is combined with the best merging groups of the strategic node's immediate fanin nodes.

In FIG. 3D, strategic node 123 is merged with its immediately preceding fanin nodes 121–122 and each of their best merging groups into group 161. The best merging groups for nodes 121 and 122 are identified by using the maximum label technique for non-strategic nodes discussed above with respect to FIG. 2. Thus, the best merging group for a non-strategic node (e.g., for nodes 121–122) is either the non-strategic node by itself or the non-strategic node combined with its predecessor nodes that have the maximum label.

The best merging group for node 121 is group 162, which includes only node 121. The best merging group of node 122 includes is group 163. Group 163 includes nodes 119–120 and 122. Thus, node 122 can be feasibly merged with its two predecessor nodes that have the maximum label (1), but node 121 cannot be merged with nodes 117–118, due to limitations of the macrocell architecture.

The technology mapping process then determines whether nodes 119–123 can be feasibly merged into one macrocell. If nodes 119–123 can be feasibly merged into a macrocell, the process calculates a depth cost and an area cost for the macrocell network formed by the merged nodes. If nodes 119–123 are merged into one macrocell, the depth cost equals two, because there is a maximum of two levels of macrocells between the input nodes and the output node. The area cost equals three, because nodes 117–118 each form a separate macrocell.

Figure 3E:
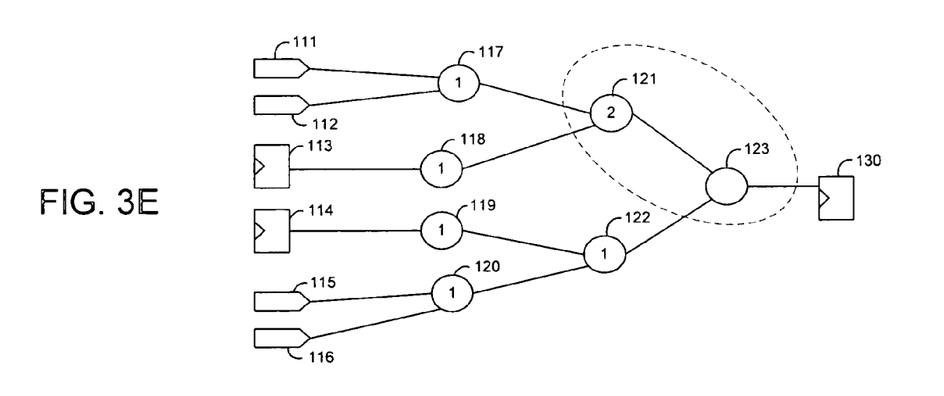
FIG. 3E illustrates an example of how a technology mapping process of the present invention can attempt to merge a strategic node with predecessor nodes that have the maximum label.

Another merging group that can be used to merge a strategic node with one or more of its predecessor nodes is illustrated in FIG. 3E. In this type of merging group, a strategic node is combined with its predecessor nodes that have the maximum label. This merging group is discussed in detail above with respect to non-strategic nodes in FIG. 2. In FIG. 3E, strategic node 123 is merged only with node 121, because node 121 has the maximum label (2) among the predecessor nodes of node 123.

If nodes 123 and 121 are merged into one macrocell, the depth cost equals two. Because nodes 117–118 form separate macrocells, and nodes 119, 120, 122 are merged into one macrocell, there is a maximum of two stages of macrocells between the input boundary nodes and the output boundary nodes. The area cost also equals four, because four separate macrocells are formed.

In the present invention, non-strategic nodes can only be merging with predecessor nodes that have the maximum label. However, strategic nodes can be merged with predecessor nodes according to any of the merging groups shown and discussed with respect to FIGS. 3A–3E.

If the nodes in the merging group of FIG. 3A can be feasibly merged into one macrocell, the technology mapping process selects this merging group to combine nodes 117–123, because it has the lowest depth cost of the five possible merging groups. If the merging group of FIG. 3A cannot be feasibly merged into one macrocell, the process selects the merging group of FIG. 3B, because this merging group has a depth cost of 2 and an area cost of 2 which is the second best alternative.

If the nodes in the FIG. 3B merging group cannot be feasibly merged into one macrocell, the technology mapping process selects the merging group of FIG. 3D. If the nodes in the FIG. 3D merging group cannot be feasibly merged into one macrocell, the process selects the merging group of FIG. 3E. The merging group of FIG. 3C is the last choice. If the nodes cannot be feasibly combined using any of the five merging groups, the strategic node is formed as a new macrocell by itself.

The technology mapping process of the present invention can consider merging a strategic node with less than the five merging groups illustrated in FIGS. 3A–3E. Also, the technology mapping process of the present invention can consider other merging groups in addition to the five merging groups shown in FIGS. 3A–3E.

Figure 3F:
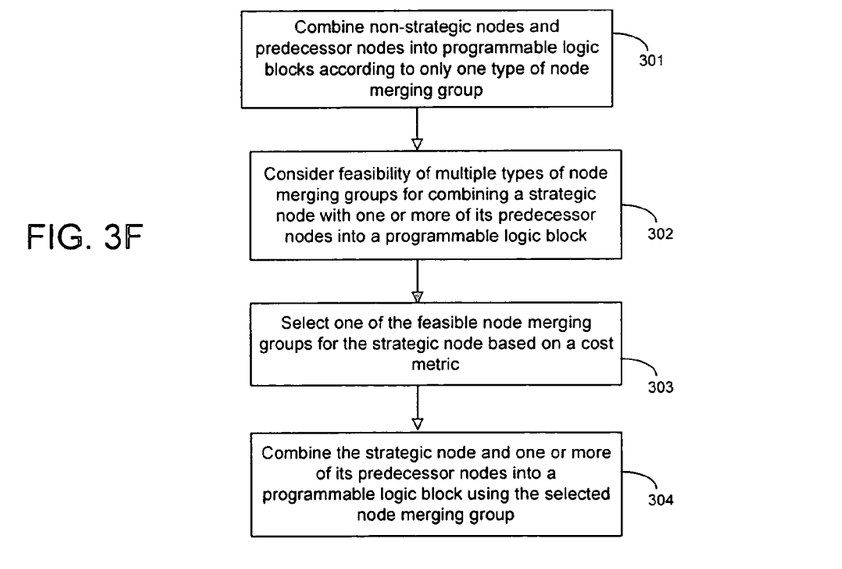
FIG. 3F is a flow chart that illustrates a process for merging non-strategic nodes and strategic nodes with their predecessor nodes into programmable logic blocks according to an embodiment of the present invention.

FIG. 3F illustrates a generalized process for combining nodes in a logic cone into programmable logic blocks such as macrocells and logic elements according to an embodiment of the present invention. At step 301, a technology mapping tool combines non-strategic nodes in a logic cone with predecessor nodes into programmable logic blocks according to only one type of node merging group.

FIG. 2 illustrates one example of a node merging group that can be used for combining non-strategic nodes as discussed above. Nodes in a logic cone are combined together into a programmable logic block only if the combination is feasible given the inherent limitations of a particular programmable logic block architecture. For example, a macrocell may be limited to 3 input signals. In this example, nodes cannot be combined into one macrocell if together they have more than 3 input signals.

At step 302, the technology mapping tool considers the feasibility of combining a strategic node with one or more of its predecessor nodes into a programmable logic block by considering multiple types of node merging groups. The feasibility of combining nodes into one programmable logic block is determined by the architecture of the programmable logic block, as previously discussed. FIGS. 3A–3E illustrate examples of various types of node merging groups that can be used for combining a strategic node with its predecessor nodes as discussed above.

At step 303, the technology mapping tool selects one of the node merging groups for the strategic node based on a cost metric. The cost metric can be based on the area and/or the depth of the resulting programmable logic block architecture. For example, the tool may select the merging group that generates the macrocell network with the shortest depth.

At step 304, the technology mapping tool combines the strategic node and one or more of its predecessor nodes into a programmable logic block using the node merging group selected in step 303.

Figure 4A:
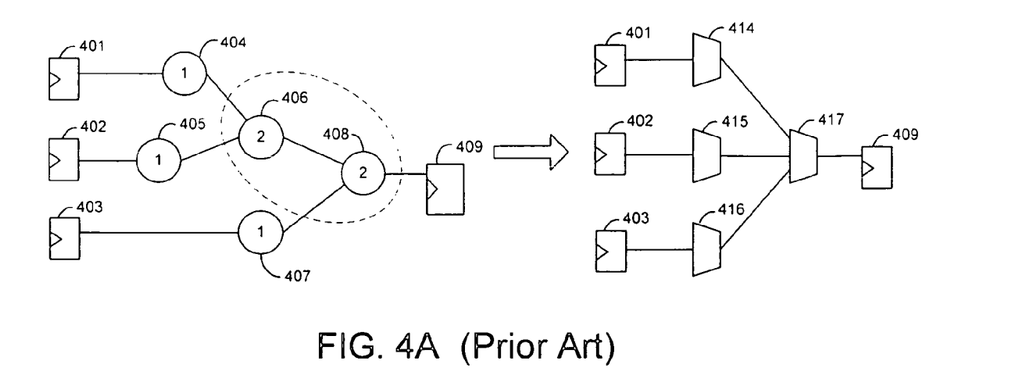
FIG. 4A illustrates an example of a prior art technology mapping process that does not consider various merging groups for a strategic node.
Figure 4B:
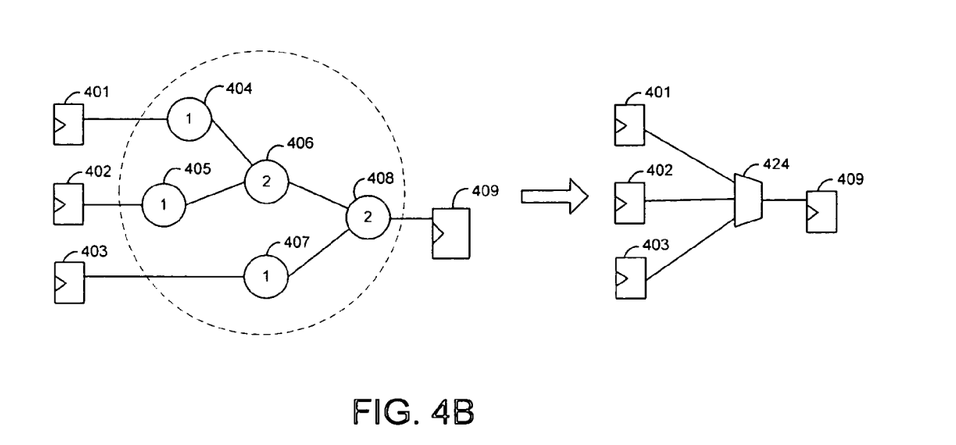
FIG. 4B illustrates an example of a technology mapping process of the present invention that considers various merging groups for a strategic node according to an embodiment of the present invention.
Figure 4C:
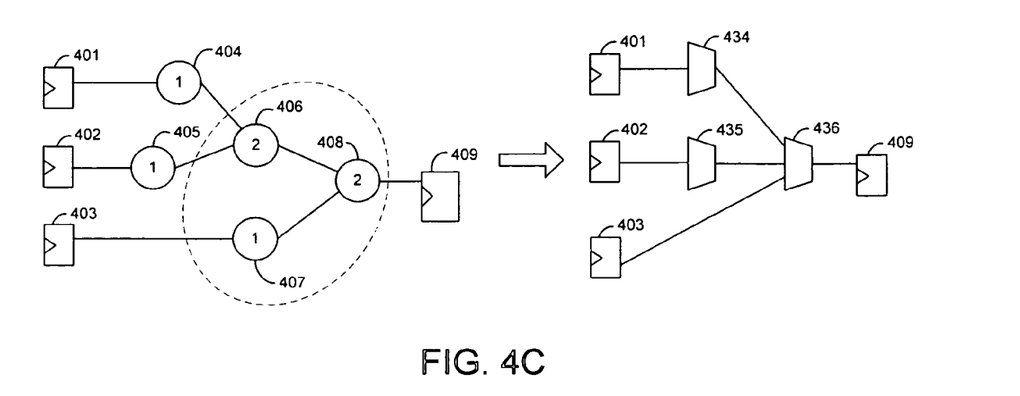
FIG. 4C illustrates an example of a technology mapping process that merges a strategic node with its immediate fanin nodes according to an embodiment of the present invention.

FIGS. 4A–4C illustrate how using various merging groups for strategic nodes in a logic cone can greatly effect how a technology mapping process generates a macrocell network. The logic cone shown on the left sides of FIGS.

4A–4C includes three input boundary nodes 401–403, non-strategic nodes 404–407, strategic node 408, and output node 409.

A prior art technology mapping process does not consider various merging groups for strategic nodes. Such a technology mapping process combines a strategic node 408 with its predecessor nodes that have the maximum label. FIG. 4A illustrates how a prior art technology mapping process assigns node 408 with the maximum label (2) of its predecessor nodes (node 406), and then combines nodes 406 and 408 into one macrocell 417. Each of the other nodes 404–405 and 407 are placed in separate macrocells 414–416, respectively.

A technology mapping process of the present invention considers various merging groups for strategic nodes in a logic cone, as discussed above. FIGS. 4B and 4C illustrate examples of how the merging groups shown in FIGS. 3A and 3C can be used to produce a macrocell network.

A technology mapping process of the present invention can attempt to combine strategic node 408 with all of its predecessor non-boundary nodes 404–407 as discussed above with respect to FIG. 3A. If such as combination is feasible, the process combines all of the non-boundary nodes 404–408 into one macrocell 424 as shown in FIG. 4B.

A technology mapping process of the present invention also considers other possible merging groups. For example, the technology mapping process can attempt to combine strategic node 408 with its immediate predecessor nodes 406–407 as discussed above with respect to FIG. 3C. If such a combination of nodes is feasible, the technology mapping process can combine nodes 406–408 into one macrocell 436 as shown in FIG. 4C. Node 404 is placed in macrocell 434 by itself, and node 405 is placed into macrocell 435 by itself.

The macrocell network created by the prior art technology mapping process has 4 macrocells grouped into 2 stages as shown in FIG. 4A. On the other hand, the macrocell network created by a technology mapping process of the present invention can, for example, have only 1 macrocells as shown in FIG. 4B, or 3 macrocells grouped into 2 stages as shown in FIG. 4C.

If the combination of shown in FIG. 4B can be feasibly placed into one macrocell network, then a technology mapping process of the present invention selects this combination. If the FIG. 4B combination cannot be feasibly placed into one macrocell, then the technology mapping process selects the FIG. 4C combination (or some other node combination) that can be feasibly placed into a macrocell network.

In both the FIG. 4B and the FIG. 4C examples, the present invention reduces the number of macrocells and/or macrocell stages in the resulting macrocell network relative to the prior art technique. Thus, the technology mapping process of the present invention can map a user design onto a more optimized network of macrocells. A more optimized macrocell network has reduced signal delay times.

Figure 5A:
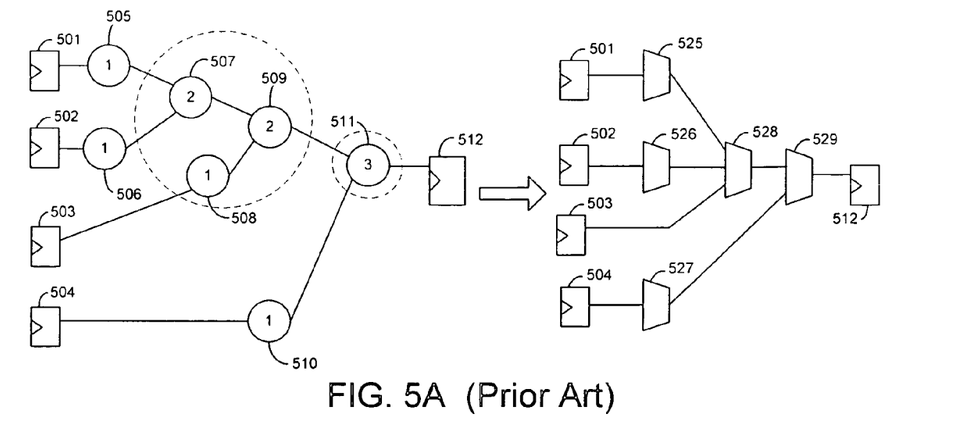
FIG. 5A illustrates an example of a prior art technology mapping process that merges a non-strategic node with its immediate fanin nodes.
Figure 5B:
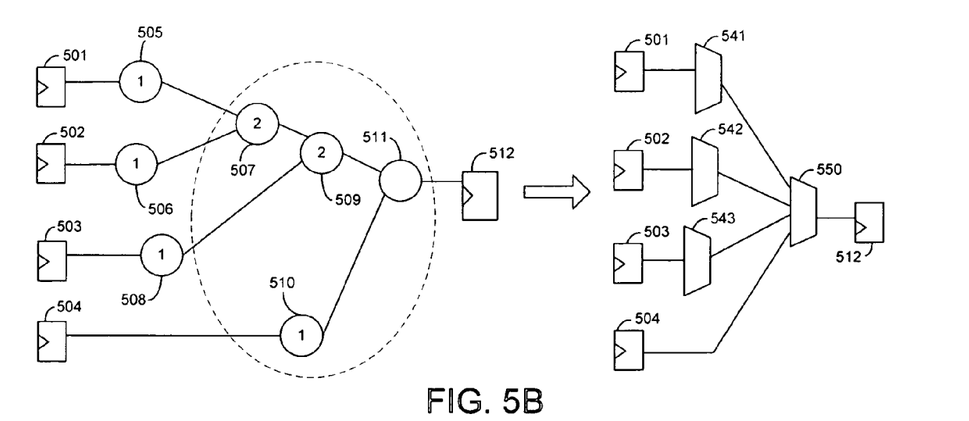
FIG. 5B illustrates an example of a technology mapping process of the present invention that considers various merging groups for strategic nodes.
Figure 5C:
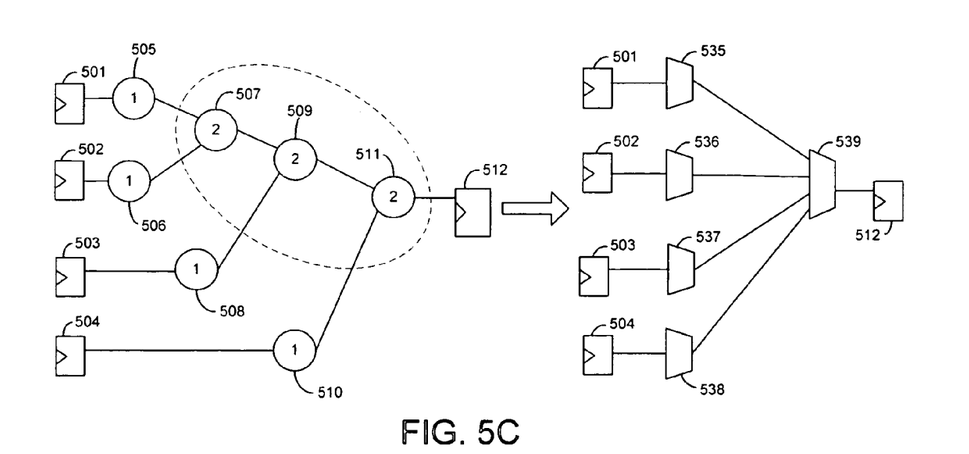
FIG. 5C illustrates another example of a technology mapping process of the present invention that considers various merging groups for strategic nodes.

FIGS. 5A–5C illustrate how the present invention can substantially reduce the number of macrocells and macrocell stages (i.e., depth) generated for a logic cone. FIG. 5A illustrates the disadvantages of using a prior art technology mapping technique called the Quartus II MAX Technology Mapper. The Quartus II MAX Technology Mapper considers various merging groups for all the nodes in a logic cone (including non-strategic nodes).

The Quartus II MAX Technology Mapper tries up to 4 merging groups for all of the nodes. These merging groups are (a) merging with all predecessor nodes, (b) merging with predecessor nodes until input boundaries or SOFT buffer boundaries are reached, (c) merging with immediate fanin nodes, and (d) merging with nodes included in the best merging group of immediate fanin nodes.

The logic cone shown on the left side of FIG. 5A includes four input boundary nodes 501–504, non-strategic nodes 505–510, strategic node 511, and output boundary node 512. For node 507, none of the four merging groups is feasible. Therefore, node 507 is placed into a macrocell by itself. For node 509, merging groups (a) and (b) are not feasible. Group (c) is chosen as the best group, which includes nodes 507–509, as shown by the dotted oval in FIG. 5A. Group (d) is same as group (c) for node 509.

In the example of FIG. 5A merging groups (a), (b) and (d) are not feasible for node 511, so the Quartus II MAX Technology Mapper places node 511 into a macrocell 529 by itself. Merging group (d) is not feasible for node 511, because the best merging group for node 509 is too big (includes nodes 507–509). Merging group (c) is feasible for node 511. However, the macrocell network resulting from merging group (c) has the same cost as the macrocell network shown in FIG. 5A, i.e., 5 macrocells with 3 depths.

According to the example of FIG. 5A, the Quartus II MAX Technology Mapper combines node 509 with its immediately preceding input nodes 507–508 to form one macrocell 528. Nodes 505, 506, and 510 are placed into separate macrocells 525, 526, and 527, respectively. Node 511 is placed a macrocell 529 by itself.

FIG. 5B illustrates how a technology mapping process of the present invention can convert logic cone 501–512 into a smaller macrocell network than the prior art technique. In FIG. 5B, a technology mapping process of the present invention attempts to combine non-strategic nodes 505–510 using only the merging group of FIG. 2 (predecessor nodes with the maximum label).

Using this merging group, nodes 507 and 509 are chosen as the best merging group for node 509, because node 507 has the maximum label of 2, and the combination is feasible. For strategic node 511, all of the 5 merging groups discussed above with respect to FIGS. 3A–3E are considered. The merging groups of FIGS. 3A and 3B are not feasible.

If the merging group of FIG. 3D is feasible for node 511, nodes 507, 509, 510, and 511 are combined into one macrocell 550. Feasibility of a combination is determined based on the macrocell architecture. A macrocell network of 4 macrocells with 2 depths is generated, as shown on the right side of FIG. 5B. Nodes 505, 506, and 508 are placed into separate macrocells 541–543, respectively.

If nodes 507, 509, 510, and 511 cannot feasibly be merged into one macrocell, the present invention determines whether nodes 507, 509, and 511 can be combined into one macrocell according to the merging group of FIG. 3E. If this combination is feasible, nodes 507, 509 and 511 are combined into macrocell 539 as shown in FIG. 5C. Nodes 505, 506, 508 and 510 are each placed into separate macrocells 535–538, respectively.

Thus, the present invention converts logic cone 505–511 into a macrocell network that has a shorter depth and/or less macrocells than the prior art technique. The macrocell network of FIG. 5B has 4 macrocells 541–543 and 550 and a depth of 2. The macrocell network of FIG. 5C has 5 macrocells 535–539 and a depth of 2. On the other hand, the macrocell network of FIG. 5A has 5 macrocells 525–529 and has a depth of 3.

It is feasible for a technology mapping process of the present invention to try various merging groups for different types of programmable integrated circuits. For example, (k, m, p)-macrocell based complex programmable logic device (CPLD) have a non-monotone property of merging constraints. Thus, the fact that a merging group cannot be feasibly grouped into one type of macrocell does not imply that a larger merging group including more nodes cannot be feasibly merged into that same type of macrocell.

Figure 6:
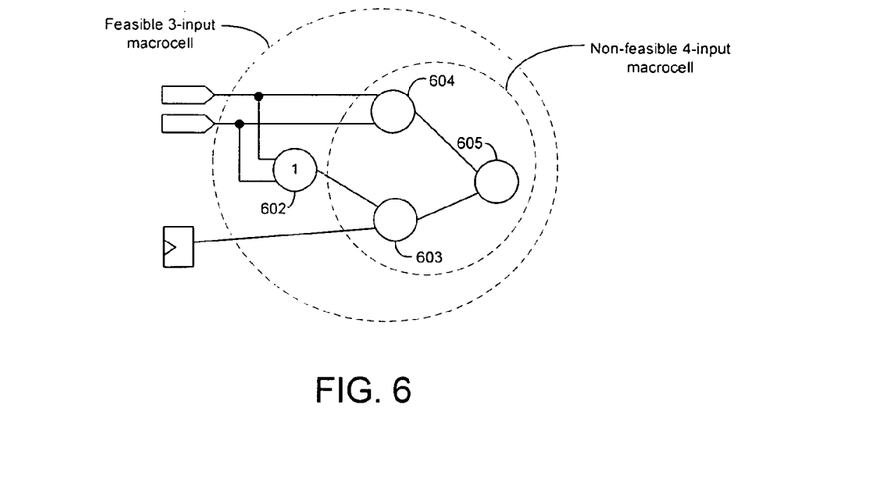
FIG. 6 illustrates merging constraints for a nodes that are not monotone according to an embodiment of the present invention.

This principle is illustrated in FIG. 6. Assume that a PLD has macrocells that are limited to only 3 inputs. For this type of architecture, nodes 603–605 in FIG. 6 cannot feasibly be merged into one macrocell by themselves, because they have 4 unique input signals. However, if the merging group were expanded to include node 602, then nodes 602–605 can be feasibly merged into macrocell, because the resulting macrocell has only 3 unique input signals.

Thus, the present invention is advantageous, in part, because it considers multiple types of merging groups for the critical strategic nodes without being locked into considering only one type of merging group. The present invention does not assume that larger merging groups are not feasible for strategic nodes, based on a determination that other types of merging groups are not feasible. The present invention also limits non-strategic nodes to one type of merging group so that the most flexible merging group options are available to the strategic nodes.

Another advantage of the present invention is that it allows new merging groups to be introduced in the future if the merging group produces good results. Thus, the present invention is not limited to the merging groups discussed herein. Other types of merging groups can be used to combine strategic nodes with one or more of their predecessor nodes into a macrocell.

The present invention allows delay-critical nodes to be merged as a macrocell. Delay-critical nodes are nodes that lie along the longest delay path of a logic cone. In order to create a minimal depth macrocell network for the logic cone, it is important to merge all delay-critical nodes to form a minimum number of macrocells in a macrocell network.

In the prior Quartus II MAX Technology Mapper, every node is likely to include non-delay-critical nodes to form a macrocell, which makes the macrocell larger in terms of product term (PTERM) usage. As a result, a successor node has lower chance to merge with a predecessor node.

The present invention also allows the best mapping solution to be selected from more choices of merging groups for the predecessor of a logic cone's output boundary node (i.e., the strategic node). As a result, the delay of the mapped macrocell network can be improved further, without increasing area utilization.

Figure 7:
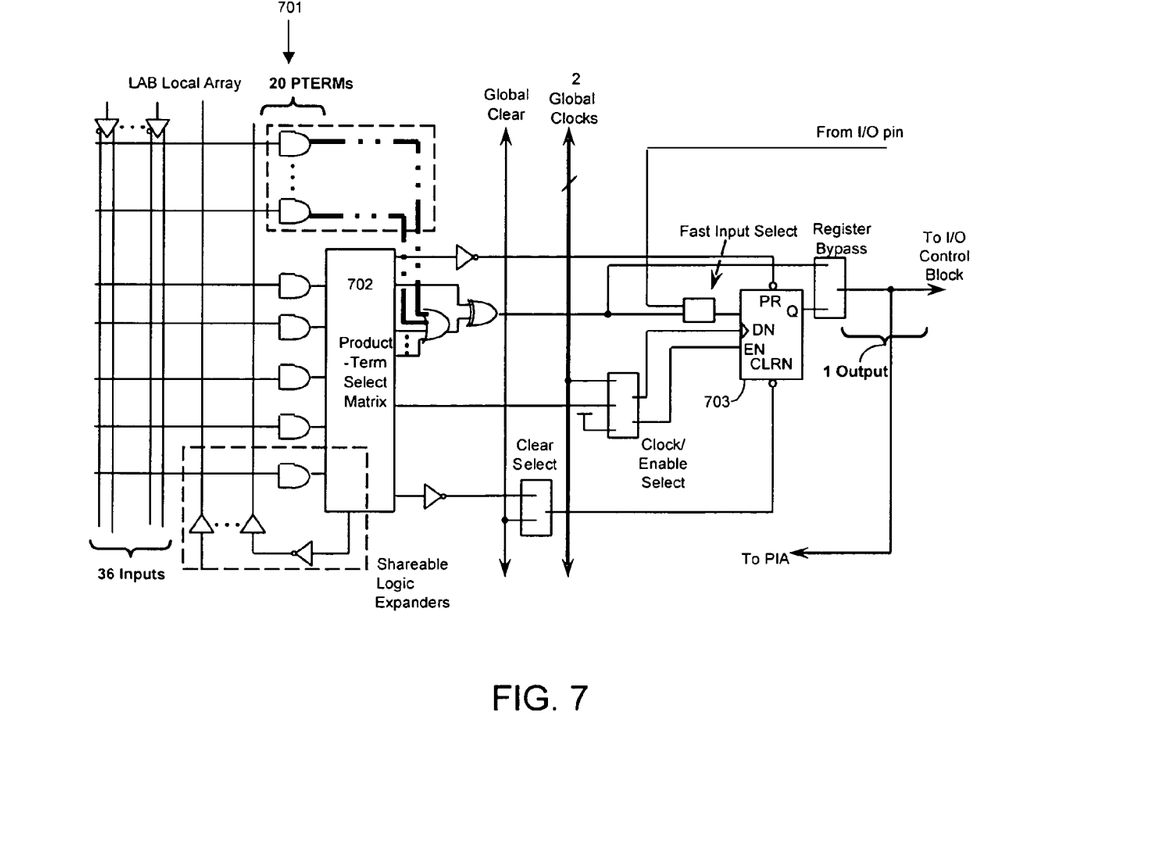
FIG. 7 is a simplified block diagram of a macrocell that can be used with the technology mapping techniques of the present invention.

FIG. 7 illustrates one type of macrocell architecture that can be used according to the principles of the present invention. The macrocell architecture is used in Altera's MAX family of CPLDs. The FIG. 7 macrocell can be individually configured for either sequential or combinatorial logic operations. The macrocell of FIG. 7 includes three functional blocks: the logic array 701, the product-term select matrix 702, and the programmable register 703.

Combinatorial logic is implemented in the logic array 701, which is represented by the AND gates in FIG. 7. Logic array 701 provides product terms in the macrocell. The product-term select matrix 702 allocates these product terms for use as either primary logic inputs (to the OR and XOR gates) to implement combinatorial functions, or as secondary inputs to the macrocell's register preset, clock, and clock enable control functions. The programmable register 703 implements sequential functions.

Figure 8:
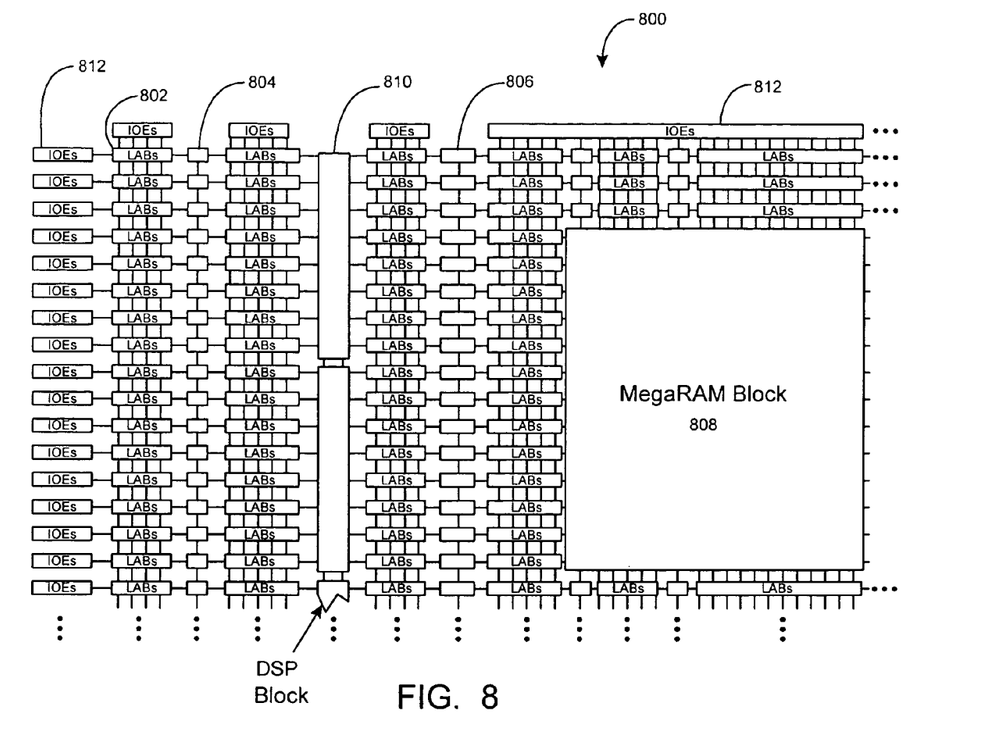
FIG. 8 is a simplified block diagram of a programmable logic device that can be used with technology mapping techniques of the present invention.

FIG. 8 is a simplified partial block diagram of an exemplary high-density PLD 800. PLD 800 embodies another type of PLD architecture that can be implemented with the technology mapping techniques of the present invention. PLD 800 includes a two-dimensional array of programmable logic array blocks (or LABs) 802 that are interconnected by a network of column and row interconnects of varying length and speed. LABs 802 include multiple (e.g., 10) logic elements (or LEs), an LE being a small unit of logic that provides for efficient implementation of user defined logic functions.

PLD 800 also includes a distributed memory structure including RAM blocks of varying sizes provided throughout the array. The RAM blocks include, for example, 512 bit blocks 804, 4 K blocks 806 and a MegaBlock 808 providing 512 K bits of RAM. These memory blocks can also include shift registers and FIFO buffers. PLD 800 further includes digital signal processing (DSP) blocks 810 that can implement, for example, multipliers with add or subtract features. I/O elements (IOEs) 812 located, in this example, around the periphery of the device support numerous single-ended and differential I/O standards. It is to be understood that PLD 800 is described herein for illustrative purposes only and that the present invention can be implemented in many different types of PLDs, FPGAs, and the like.

Figure 9:
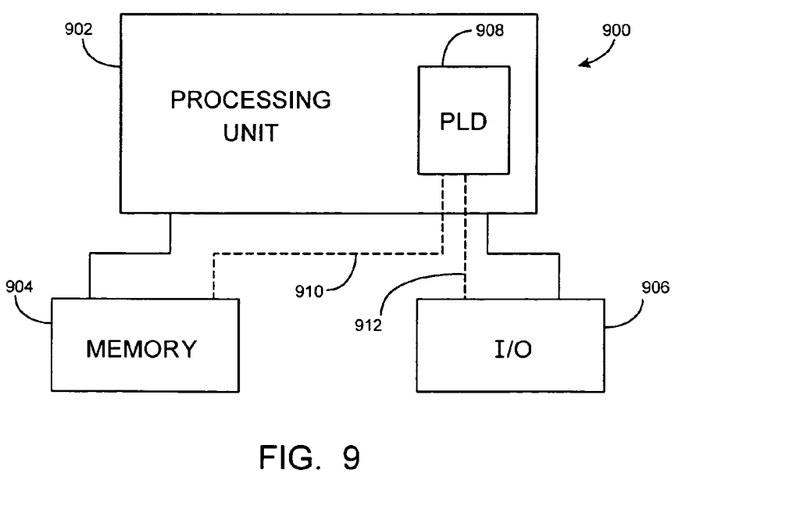
FIG. 9 is a block diagram of an electronic system that can implement embodiments of the present invention.

While PLDs of the type shown in FIG. 8 provide many of the resources required to implement system level solutions, the present invention can also benefit systems wherein a PLD is one of several components. FIG. 9 shows a block diagram of an exemplary digital system 900, within which the present invention can be embodied. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904 and an I/O unit 906 interconnected together by one or more buses. According to this exemplary embodiment, a programmable logic device (PLD) 908 is embedded in processing unit 902. PLD 908 can serve many different purposes within the system in FIG. 4. PLD 908 can, for example, be a logical building block of processing unit 902, supporting its internal and external operations. PLD 908 is programmed to implement the logical functions necessary to carry on its particular role in system operation. PLD 908 can be specially coupled to memory 904 through connection 910 and to I/O unit 906 through connection 912.

Processing unit 902 can direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 908 can control the logical operations of the system. In an embodiment, PLD 908 acts as a reconfigurable processor, which can be reprogrammed as needed to handle a particular computing task. Alternately, programmable logic device 908 can itself include an embedded microprocessor. Memory unit 904 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for converting a user design for a programmable integrated circuit to a network of programmable logic blocks (PLBs), the method comprising:
   combining non-strategic nodes in a logic cone with their predecessor nodes into PLBs only according to a first node merging group, wherein at least a portion of the user design is represented by the logic cone;
   selecting one of a plurality of second node merging groups that can be used to combine a strategic node in the logic cone and at least one of its predecessor nodes into a PLB; and
   combining the strategic node with at least one of its predecessor nodes into one PLB using the selected second node merging group.

2. The method according to 1 claim wherein selecting one of the second node merging groups further comprises:
   determining whether the strategic node can be feasibly combined with at least one of its predecessor nodes into one PLB by considering limitations of the PLB's architecture.

3. The method defined in claim 1 wherein selecting one of the second node merging groups further comprises:
   selecting the second merging group that generates the shortest depth of programmable logic blocks in a network resulting from a combination using that selected merging group.

4. The method defined in claim 1 wherein selecting one of the second node merging groups further comprises:
   selecting one of the second merging groups based on a cost metric that weighs area and depth of a programmable logic block network resulting from combinations using each second merging group.

5. The method defined in claim 1 wherein combining the non-strategic nodes with their predecessor nodes into the PLBs further comprises:
   combining each non-strategic node and at least one of its predecessor nodes that have a maximum label value into one programmable logic block according to the first merging group, if the combination is feasible based on an architecture of the programmable logic block; and
   for each non-strategic node in the logic cone that cannot feasibly be combined with at least one of its predecessor nodes according to the first merging group, assigning a label value to the non-strategic node that equals the label maximum value of its predecessor nodes plus one.

6. The method defined in claim 1 wherein combining the strategic node with at least one of its predecessor nodes into one programmable logic block using the selected second node merging group further comprises:
   combining the strategic node with all of its non-boundary predecessor nodes into one programmable logic block.

7. The method defined in claim 1 wherein combining the strategic node with at least one of its predecessor nodes into one programmable logic block using the selected second node merging group further comprises:
   combining the strategic node only with its immediately preceding fanin nodes.

8. The method defined in claim 1 wherein combining the strategic node with at least one of its predecessor nodes into one programmable logic block using the selected second node merging group further comprises:
   combining the strategic node with its predecessor nodes in all directions until an input boundary node or a soft buffer boundary node is reached.

9. The method defined in claim 1 wherein combining the strategic node with at least one of its predecessor nodes into one programmable logic block using the selected second node merging group further comprises:
   combining the strategic node with best merging groups of the strategic node's immediate fanin nodes.

10. The method defined in claim 1 wherein combining the strategic node with at least one of its predecessor nodes into one programmable logic block using the selected second node merging group further comprises:
    combining the strategic node with its predecessor nodes that have the maximum label.

11. The method defined in claim 1 wherein the PLBs are macrocells and the programmable integrated circuit is a programmable logic device.

12. A computer system for converting a user design for a programmable integrated circuit into programmable logic blocks (PLBs), the computer system comprising:
    code for combining non-strategic nodes in a logic cone and their predecessor nodes into PLBs according to only a first node merging group, wherein at least a portion of the user design is represented by the logic cone;
    code for selecting one of a plurality of second node merging groups that can be used to combine a strategic node in the logic cone and at least one of its predecessor nodes into a PLB;
    code for combining the strategic node with at least one of its predecessor nodes into one PLB according to the selected second node merging group; and
    a computer readable media for storing the codes.

13. The computer system according to claim 12 wherein the code for selecting one of the plurality of second node merging groups further comprises:
    code for identifying which of the second node merging groups can be feasibly placed inside a PLB based on constraints imposed by an architecture of the PLB.

14. The computer system according to claim 13 wherein the code for selecting one of the plurality of second node merging groups further comprises:
    if more than one of the second node merging groups can be feasibly placed inside one PLB, the code for selecting selects one of the feasible second node merging groups based on a cost metric that weighs area and depth of a PLB network resulting from combinations using these second merging groups.

15. The computer system according to claim 13 wherein the code for selecting one of the plurality of second node merging groups further comprises:
    if more than one of the second node merging groups can be feasibly placed inside one PLB, the code for selecting selects the second node merging group that generates the least stages of PLBs in a network resulting from a combination using that second merging group.

16. The computer system according to claim 12 wherein the PLBs are macrocells and the programmable integrated circuit is a programmable logic device.

17. The computer system according to claim 12 wherein the second node merging groups include a merging group that combines a strategic node with all of its non-boundary predecessor nodes into one PLB.

18. The computer system according to claim 17 wherein the second node merging groups include a merging group that combines a strategic node only with its immediately preceding fanin nodes into one PLB.

19. The computer system according to claim 18 wherein the second node merging groups include a merging group that combines a strategic node with its predecessor nodes in all directions until an input boundary node or a soft buffer boundary node is reached.

20. The computer system according to claim 19 wherein the second node merging groups include a merging group that combines the strategic node with best merging groups of the strategic node's immediate fanin nodes.

21. The computer system according to claim 19 wherein the second node merging groups include a merging group that combines the strategic node with its predecessor nodes that have a maximum label.

22. The computer system according to claim 12 wherein the code for combining non-strategic nodes and their predecessor nodes into the PLBs combines each non-strategic node and at least one of its predecessor nodes that have a maximum label value into one PLB, if the combination is feasible based on an architecture of the PLB.

23. A method for converting a user design for a programmable integrated circuit into a network of programmable logic blocks (PLBs) for a programmable integrated circuit, the method comprising:

combining first nodes in a logic cone only with their predecessor nodes that have a maximum label into PLBs, wherein at least a portion of the user design is represented by the logic cone;

selecting one of a plurality of node merging groups that can be used to combine a second node in the logic cone and at least one of its predecessor nodes into a PLB; and combining the second node with at least one of its predecessor nodes into one PLB using the selected node merging group, wherein the second node is connected directly to an output boundary node of the logic cone and does not fanout to other non-boundary nodes, and the first nodes are remaining non-boundary nodes in the logic cone.

* * * * *

UNITED STATES PATENT AND TRADEMARK OFFICE
CERTIFICATE OF CORRECTION

| | | |
|---|---|---|
| PATENT NO. | : 7,020,864 B1 | Page 1 of 1 |
| APPLICATION NO. | : 10/721573 | |
| DATED | : March 28, 2006 | |
| INVENTOR(S) | : Loong | |

It is certified that error appears in the above-identified patent and that said Letters Patent is hereby corrected as shown below:

In claim 3, Col. 13 at line 39, after "generates" replace "the" with --a--.

In claim 10, Col. 14 at line 27, before "maximum" replace "the" with --a--.

Signed and Sealed this

First Day of August, 2006

JON W. DUDAS
*Director of the United States Patent and Trademark Office*